(12) United States Patent
Liu et al.

(10) Patent No.: US 8,921,823 B2
(45) Date of Patent: *Dec. 30, 2014

(54) MEMORY CELL CONSTRUCTIONS, AND METHODS FOR FABRICATING MEMORY CELL CONSTRUCTIONS

(71) Applicant: Micron Technology, Inc., Boise, ID (US)

(72) Inventors: Jun Liu, Boise, ID (US); Jian Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/243,710

(22) Filed: Apr. 2, 2014

(65) Prior Publication Data

US 2014/0209851 A1    Jul. 31, 2014

Related U.S. Application Data

(60) Continuation of application No. 13/763,664, filed on Feb. 9, 2013, now Pat. No. 8,735,216, which is a division of application No. 13/043,071, filed on Mar. 8, 2011, now Pat. No. 8,395,137.

(51) Int. Cl.
*H01L 45/00* (2006.01)
*H01L 21/06* (2006.01)

(52) U.S. Cl.
CPC ............ *H01L 45/1608* (2013.01); *H01L 21/06* (2013.01); *H01L 45/06* (2013.01); *H01L 45/128* (2013.01); *H01L 45/144* (2013.01); *H01L 45/1666* (2013.01); *H01L 45/16* (2013.01)

USPC ......... 257/4; 257/2; 257/3; 257/5; 257/E29.3; 257/E29.309

(58) Field of Classification Search
USPC ................ 257/68–71, 296–309, 905–908, 257/314–326, E27.078, E29.3–E29.309
See application file for complete search history.

(56) References Cited

U.S. PATENT DOCUMENTS

| | | | |
|---|---|---|---|
| 6,204,125 B1 | 3/2001 | Lee et al. |
| 7,327,036 B2 | 2/2008 | Borghs et al. |
| 7,531,442 B2 | 5/2009 | Pallinti et al. |
| 2007/0187664 A1 | 8/2007 | Happ |
| 2008/0197333 A1 | 8/2008 | Lung |
| 2010/0109085 A1 | 5/2010 | Kim et al. |
| 2010/0127327 A1 | 5/2010 | Chidambarrao |
| 2010/0213431 A1 | 8/2010 | Yeh et al. |
| 2010/0224966 A1 | 9/2010 | Chen |
| 2010/0258877 A1 | 10/2010 | Sadoughi |

*Primary Examiner* — Mamadou Diallo
(74) *Attorney, Agent, or Firm* — Wells St. John, P.S.

(57) ABSTRACT

Some embodiments include methods for fabricating memory cell constructions. A memory cell may be formed to have a programmable material directly against a material having a different coefficient of expansion than the programmable material. A retaining shell may be formed adjacent the programmable material. The memory cell may be thermally processed to increase a temperature of the memory cell to at least about 300° C., causing thermally-induced stress within the memory cell. The retaining shell may provide a stress which substantially balances the thermally-induced stress. Some embodiments include memory cell constructions. The constructions may include programmable material directly against silicon nitride that has an internal stress of less than or equal to about 200 megapascals. The constructions may also include a retaining shell silicon nitride that has an internal stress of at least about 500 megapascals.

21 Claims, 3 Drawing Sheets

MEMORY CELL CONSTRUCTIONS, AND METHODS FOR FABRICATING MEMORY CELL CONSTRUCTIONS

RELATED PATENT DATA

This patent resulted from a continuation of U.S. patent application Ser. No. 13/763,664, which was filed Feb. 9, 2013, which issued as U.S. Pat. No. 8,735,216, and which is hereby incorporated herein by reference; which resulted from a divisional of U.S. patent application Ser. No. 13/043,071, which was filed Mar. 8, 2011, which issued as U.S. Pat. No. 8,395,137, and which is hereby incorporated herein by reference.

TECHNICAL FIELD

Memory cell constructions, and methods for fabricating memory cell constructions.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. There is a continuing effort to reduce the number of components in individual devices because such can reduce the size of finished constructions, and can simplify processing. The smallest and simplest memory cell will likely be comprised of two electrodes having a programmable material received between them.

Suitable programmable materials have two or more selectable memory states to enable storing of information by an individual memory cell. The reading of the cell comprises determination of which of the states the programmable material is in, and the writing of information to the cell comprises placing the programmable material in a predetermined state.

Phase change materials, such as ovonic memory materials (for instance, various chalcogenides), are being considered for utilization as programmable materials in memory cells. The phase change materials transform from one phase to another through application of appropriate electrical stimulus, with each phase corresponding to a different memory state. The ovonic memory materials may be utilized in combination with selection devices, such as diodes, transistors, or ovonic threshold switches.

A problem encountered in the utilization of ovonic materials is delamination of the ovonic materials from adjacent materials. Such delamination can be detrimental to memory cell performance, and in some cases may lead to failure of memory cells. It would be desirable to develop improvements which alleviate or prevent the delamination problems encountered during utilization of ovonic materials.

DETAILED DESCRIPTION OF THE ILLUSTRATED EMBODIMENTS

Some embodiments include methods of offsetting thermally-induced stresses in memory cells. Such methods may include provision of retaining material shells that partially surround the memory cells, with such shells being configured to impart stresses that substantially balance thermally-induced stresses. In some embodiments, delamination and other thermally-induced problems associated with phase change random access memory (PCRAM) may be alleviated or prevented through utilization of retaining material shells.

Example embodiments are described with reference to FIGS. 1-5.

Figure 1:
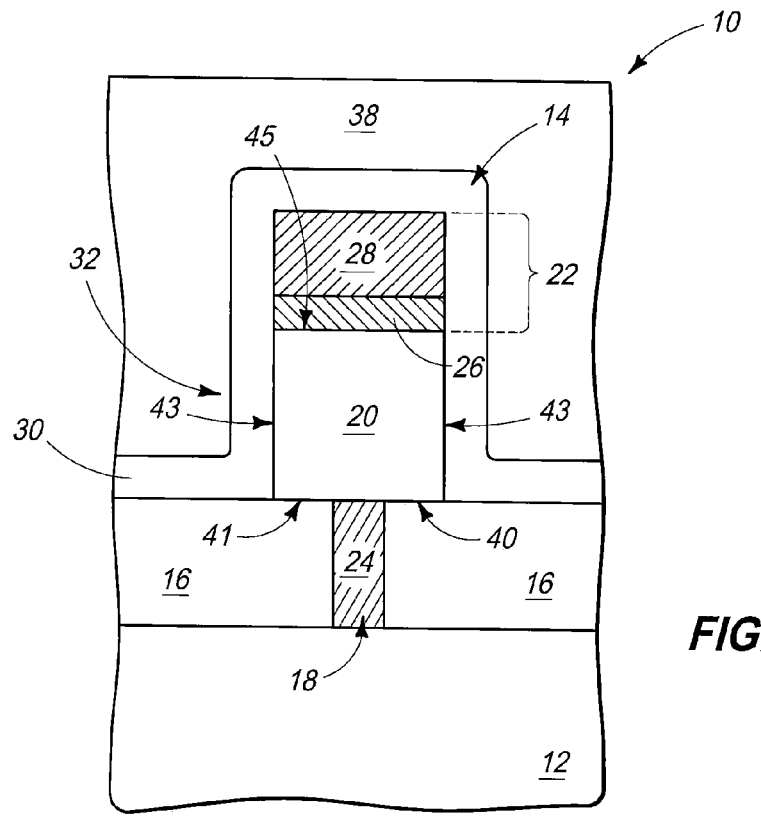
FIG. 1 is a diagrammatic, cross-sectional view of a portion of a semiconductor construction, and illustrates an example embodiment memory cell construction.

Referring to FIG. 1, a semiconductor construction 10 includes a memory cell 14 supported over a substrate 12.

The memory cell includes a bottom electrode 18, a programmable material 20 over the bottom electrode, and a top electrode 22 over the programmable material.

The substrate 12 may comprise any suitable material or combination of materials, and in some embodiments may comprise one or more electrically insulative materials supported over a semiconductor material. Although substrate 12 is shown to be homogenous, the substrate may comprise numerous materials. For instance, in some embodiments the substrate 12 may comprise silicon dioxide over monocrystalline silicon. Such substrate may be referred to as a semiconductor substrate, or as a portion of a semiconductor substrate; with the terms "semiconductive substrate," "semiconductor construction" and "semiconductor substrate" meaning any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

An electrically insulative material 16 is over substrate 12, and the bottom electrode 18 of memory cell 14 extends through the electrically insulative material 16. In some embodiments, the insulative material 16 and electrode 18 may be considered to form a base which supports the programmable material 20. In the shown embodiment, a bottom surface of the programmable material directly contacts both the bottom electrode 18 and the insulative material 16 of such base.

In some embodiments, the electrically insulative material 16 may comprise, consist essentially of, or consist of low-stress silicon nitride; with "low-stress" silicon nitride being silicon nitride having an internal stress of less than or equal to 200 megapascals. The low-stress silicon nitride may be formed with any suitable processing. Example processing which may be utilized to form silicon nitride having an internal stress of less than or equal to 200 megapascals can include plasma-enhanced chemical vapor deposition (PECVD), atomic layer deposition (ALD) and/or low-pressure chemical vapor deposition (LPCVD).

The bottom electrode 18 comprises a bottom electrode material 24. Such material may comprise any suitable composition or combination of compositions; and in some embodiments may comprise, consist essentially of, or consist of one or more of TiSiN, TiN, and TaSiN (where the formulas indicate the components within the listed compounds, rather than designating specific stoichiometries of such components).

The programmable material 20 may comprise any suitable composition or combination of compositions; and in some embodiments may comprise ovonic material, such as chalcogenide or other suitable phase change material. For instance, in some embodiments the programmable material 20 may comprise, consist essentially of, or consist of a composition containing germanium, antimony and tellurium; such as, for example, $Ge_2Sb_2Te_5$.

The top electrode 24 is shown to comprise two different electrically conductive materials 26 and 28, with the material 26 being directly against the programmable material 20. In some embodiments, the material 26 may comprise, consist essentially of, or consist of TiN or WN (where the formulas indicate the components within the listed compounds, rather than designating specific stoichiometries of such components); and the material 28 may comprise, consist essentially of, or consist of tungsten. In some embodiments, the memory cell may have a width within a range of from about 20 nanometers to about 200 nanometers across the top electrode along the cross-section of FIG. 1.

The memory cell 14 may be one of a large plurality of identical memory cells incorporated into a memory array. The bottom and top electrodes 18 and 22 may be comprised by, or electrically coupled to, access/sense lines (i.e., wordlines/bitlines). The individual memory cells of the memory array may be uniquely addressed through combinations of access/sense lines to enable the individual memory cells to be programmed and read during various operations of the memory array. In some embodiments, the top electrode 22 may be configured as an access/sense line extending in and out of the page relative to the view of FIG. 1, and the bottom electrode 18 may be coupled to an access/sense line (not shown) that extends substantially perpendicularly to the top electrode line.

Select devices (not shown), such as diodes, transistors, or ovonic threshold switches (OTSs), may be coupled with the memory cells of the PCRAM array to alleviate undesired leakage within the memory array. A select device may be between an access/sense line and the programmable material of a memory cell in some embodiments, and may be on an opposing side of an access/sense line from the programmable material in other embodiments.

An electrically insulative material 38 is over the memory cell 14, and may be utilized for electrical isolation of the illustrated memory cell from adjacent memory cells (not shown) of a memory array. The electrically insulative material 38 may comprise any suitable composition or combination of compositions; and in some embodiments may comprise, consist essentially of, or consist of one or more of silicon dioxide and any of various doped silicon oxides. Example doped silicon oxides are borophosphosilicate glass (BPSG), phosphosilicate glass (PSG), fluorosilicate glass (FSG), etc.

As discussed above in the "Background" section of this disclosure, a problem encountered with some memory cells is delamination of ovonic material from other materials. An aspect of some of the embodiments provided herein is recognition that the delamination may be due, at least in part, to thermal mismatch between various materials of the memory cells. For instance, the memory cell of FIG. 1 may have a substantially different coefficient of expansion of the programmable material 20 relative to one or more of the electrically insulative material 16, the electrically insulative material 38, the bottom electrode material 24, the top electrode material 26 and the top electrode material 28. For example, $Ge_2Sb_2Te_5$ may have a thermal expansion coefficient of $18.1\times10^{-6}/C.°$, $SiO_2$ may have a thermal expansion coefficient of $0.57\times10^{-6}/C.°$, BPSG may have a thermal expansion coefficient of $0.6\times10^{-6}/C.°$, low-stress silicon nitride may have a thermal expansion coefficient of $3.0\times10^{-6}/C.°$, TiN may have a thermal expansion coefficient of $12\times10^{-6}/C.°$, and W may have a thermal expansion coefficient of $4.5\times10^{-6}/C.°$ The different rates of thermal expansion of the various materials of the memory cell can create mechanical stresses within the memory cell that may ultimately lead to delamination of the programmable material from one or more of the materials directly against such programmable material. Persons of ordinary skill in the art will recognize that mechanical stresses may be considered to be a sum of internal stresses and external stresses. For instance, the individual materials of a memory cell may have internal stresses associated with, among other things, the compositions of the materials, the lattice configurations of the materials, etc.; and may have external stresses induced by the environments surrounding such materials.

An aspect of some embodiments is recognition that it may be possible to compensate for the thermally-induced stresses of the memory cell by providing an internally-stressed retaining shell at least partially around the programmable material of the memory cell. Such retaining shell may substantially balance the thermally-induced stresses, and thereby alleviate or prevent thermally-induced delamination from occurring within the memory cell. The thermally-induced stresses may be referred to as first stresses, and the stress provided by the retaining shell may be referred to as a second stress. In some applications, the second stress may be at least about equal to the first stresses under pre-defined thermal conditions to substantially balance the first stresses when the memory cell is exposed to such conditions.

A memory cell may be at a temperature below about 100° C. (for instance, the memory cell may be at a room temperature of about 25° C.) as-fabricated, and then may be heated to a higher temperature during fabrication of various components and materials that are subsequently formed as part of the integrated circuit comprising the memory cell. Thermally-induced delamination may become problematic during the thermal transition of a memory cell to processing temperatures which equal or exceed about 300° C. (i.e., during a thermal transition of the memory cell across a temperature differential of at least about 200° C.). Accordingly, some aspects include utilization of a retaining shell configured to balance thermally-induced stresses that manifest during thermal processing to temperatures of at least about 300° C. In particular applications, the retaining shell may be configured to balance thermally-induced stresses that manifest during thermal processing to temperatures of at least about 400° C. (i.e., during a thermal transition of the memory cell which increases a temperature of the cell by at least about 300° C.), and in some applications the retaining shell may be configured to balance thermally-induced stresses that manifest during thermal processing to temperatures of at least about 450° C. (i.e., during a thermal transition of the memory cell which increases a temperature of the cell by at least about 350° C.).

In the embodiment of FIG. 1, a retaining shell 32 extends partially around a periphery of memory cell 14, with such retaining shell comprising a retaining shell material 30. The retaining shell material 30 may comprise any suitable composition or combination of compositions, and in some embodiments may comprise one or both of an electrically insulative material and an electrically conductive material. For instance, in some embodiments the retaining shell material may comprise, consist essentially of or consist of one or more of metal, carbon, silicon nitride and silicon dioxide. If the retaining shell material comprises metal, such metal may be in elemental form (for instance, elemental copper, etc.), may be an alloy or mixture, or may be a metal-containing compound (metal nitride, metal silicide, etc.).

In some embodiments, the retaining shell material 30 may comprise high-stress silicon nitride; with "high-stress" silicon nitride being silicon nitride having an internal stress of at least about 500 megapascals. Such high-stress second nitride may be formed utilizing any suitable methodology. Example methodology for forming the high-stress silicon nitride may include one or more of PECVD, LPCVD and ALD, utilizing tailored conditions which enhance hydrogen removal during growth of the silicon nitride. For instance, high stress silicon nitride may be formed utilizing a multi-layer deposition technique with plasma as an energy source. The plasma can provide energy to break Si—H and N—H bonds in deposited films (i.e., layers), leading to enhanced hydrogen removal. As another example, ultraviolet assisted thermal processing (UVTP) may be utilized in a deposition process, with UV photons being an energy source. The UV photon energy can break bonds, and hydrogen from neighboring broken bonds can then combine to form molecular $H_2$. The molecular $H_2$ can diffuse out, leading to enhanced hydrogen removal.

The retaining shell material 30 may be formed to any suitable thickness. In embodiments in which the retaining shell material consists of high-stress silicon nitride, the retaining shell material may be formed to a thickness of, for example, about 20 nanometers.

In the shown embodiment, the retaining shell material 30 is directly against the insulative material 16. Thus, in embodiments in which retaining shell material 30 comprises high-stress silicon nitride and insulative material 16 comprises low-stress silicon nitride, the high-stress silicon nitride of the retaining shell material may be directly against low-stress silicon nitride of the insulative material.

The programmable material 20 has a periphery 40 along the cross-section section of the view of FIG. 1, with such periphery including a bottom surface 41, sidewall surfaces 43, and a top surface 45. The retaining shell 32 is shown to surround about three-fourths of such periphery in the embodiment of FIG. 1. In other embodiments, the retaining shell may have a different configuration in order to provide a desired stress balance. In some example embodiments, the retaining shell may surround at least about one-half of the periphery of the programmable material along a cross-section (for instance, the cross-section of the view of FIG. 1), the retaining shell may surround at least about two-thirds of such periphery of the programmable material, etc.

The stress provided by the retaining shell may have opposite characteristics to thermally-induced stresses within the memory cell in some embodiments. For instance, the thermally-induced stresses may be primarily compressive stresses, and the stress provided by the retaining shell may be primarily tensile; or vice versa.

Figure 2:
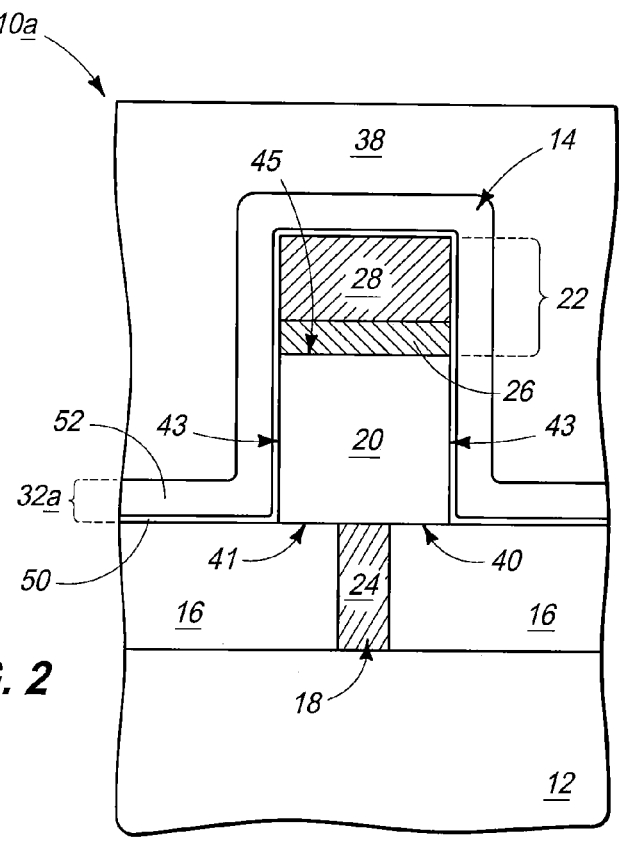
FIG. 2 is a diagrammatic, cross-sectional view of a portion of another semiconductor construction, and illustrates another example embodiment memory cell construction.

The retaining shell 32 is illustrated in FIG. 1 as a single homogeneous material. In some embodiments, the retaining shell may be heterogeneous. In some embodiments, the heterogeneous retaining shell may comprise a laminate of two or more different materials. FIG. 2 illustrates a semiconductor construction 10a analogous to the construction 10 of FIG. 1, but having a retaining shell 32a which is a laminate of two different retaining shell materials 50 and 52. The materials 50 and 52 may be considered to be an inner retaining shell material and an outer retaining shell material, respectively. The inner and outer retaining shell materials are shown to be different thickness relative to one another. In other embodiments, the inner and outer retaining shell materials may have other relative thicknesses than is shown in FIG. 2, and in some embodiments the inner and outer retaining show materials may be about the same thickness as one another. Although the illustrated laminate has two different materials, in other embodiments the laminate may have three or more materials. If the laminate has three or more materials, all of the materials may be different in composition relative to one another, or two or more materials may have a same composition as one another.

In the shown embodiment, both of the inner and outer retaining shell materials 50 and 52 extend along the sidewall surfaces of programmable material 20, as well as along an upper surface of insulative material 16, and along the upper surface of top electrode 22. In other embodiments, one of the materials 50 and 52 may be only along the sidewall surfaces 43 of the programmable material, while the other of the materials 50 and 52 extends further around the periphery 40 of the programmable material. For instance, in some embodiments the inner retaining shell material 50 may be a liner which protects sidewall surfaces 43 of the programmable material from reaction with the outer retaining shell material.

In some example embodiments, the inner retaining shell material 50 may comprise silicon dioxide, while the outer retaining shell material 52 comprises high-stress silicon nitride. In some example embodiments, one of the retaining shell materials 50 and 52 may comprise silicon nitride while the other comprises carbon. In some example embodiments, one of the materials 50 and 52 may comprise carbon while the other comprises silicon carbide.

In the shown embodiment, the materials 50 and 52 are referred to as both being retaining shell materials, which implies that both of the materials 50 and 52 provide stresses which are utilized to offset thermally-induced stresses of the memory cell. In some embodiments, constructions similar to 10a may be formed, but only one of the materials 50 and 50a will provide stresses utilized to offset thermally-induced stresses within the memory cell. For instance, in some embodiments, a material analogous to the material 52 may be a retaining shell material while a material analogous to the material 50 only functions as a spacer which displaces the retaining shell material from one or more of the underlying materials 16, 20, 26 and 28.

In some embodiments, one or more materials of a memory cell may be tailored to assist the retaining shell in canceling or alleviating thermally-induced stresses. For instance, one or both of the electrically conductive materials 26 and 28 may be tailored to assist in canceling or alleviating thermally-induced stresses.

The retaining shells discussed above may be incorporated into memory cell constructions utilizing any suitable processing. For instance, FIGS. 3-5 illustrate example processing that may be utilized to form the construction 10 of FIG. 1.

Figure 3:
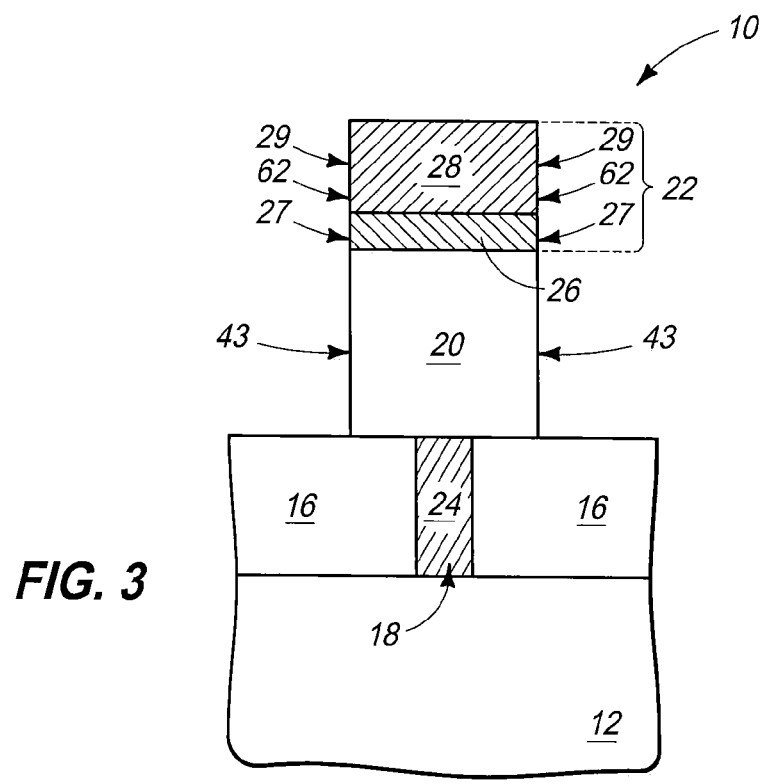
FIGS. 3-5 are diagrammatic, cross-sectional views of a portion of a semiconductor construction at various process stages of an example embodiment method of forming a memory cell construction.

Referring to FIG. 3, construction 10 is shown at a processing stage prior to that of FIG. 1. The construction has the insulative material 16 over substrate 12, and has the bottom electrode 18 extending through the insulative material 16. Also, the construction has the programmable material 20 and the top electrode 22 formed over the bottom electrode 18. The programmable material 20 and the top electrode 22 are patterned into a memory cell configuration with sidewalls 62 extending upwardly from an upper surface of insulative material 16. The sidewall surfaces 62 include sidewall surfaces 27 of conductive material 26, sidewall surfaces 29 of conductive material 28, and sidewall surfaces 43 of programmable material 20. In some embodiments, the sidewall surfaces 43, 27 and 29 may be considered to be coextensive with one another along the cross-section shown in FIG. 3.

Figure 4:
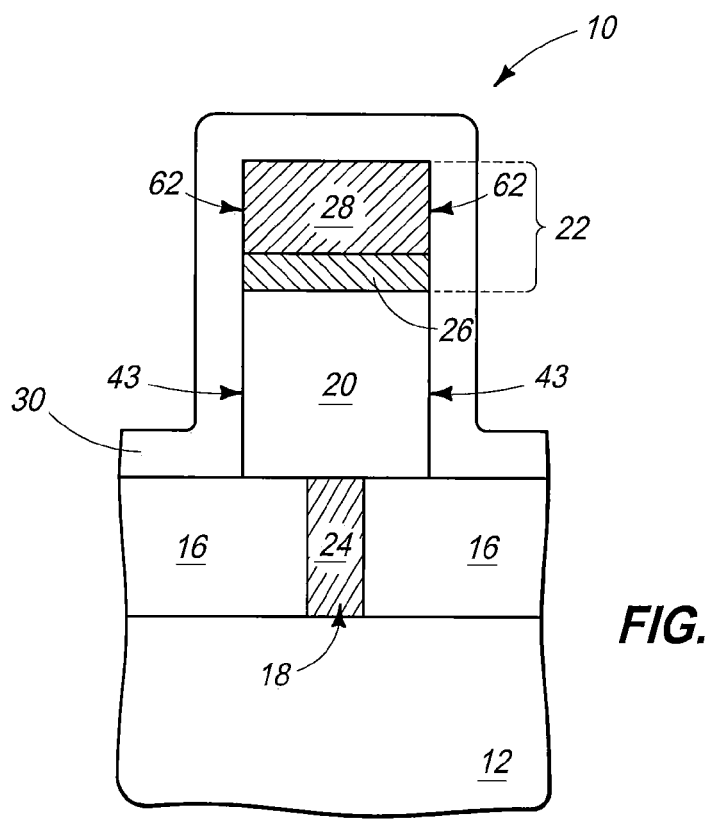

Referring to FIG. 4, retaining shell material 30 is formed over insulative material 16, along the sidewalls 62 of the memory cell configuration, and across an upper surface of the top electrode 22. The retaining shell material may be formed utilizing any suitable processing, including, for example, one or more of the processes discussed above with reference to FIG. 1. In some example embodiments, the retaining shell material 30 and the insulative material 16 may both comprise silicon nitride, and thus may comprise a common composition as one another. However, the silicon nitride of the retaining shell material may be high-stress silicon nitride, while the silicon nitride of insulative material 16 may be low-stress silicon nitride.

Figure 5:
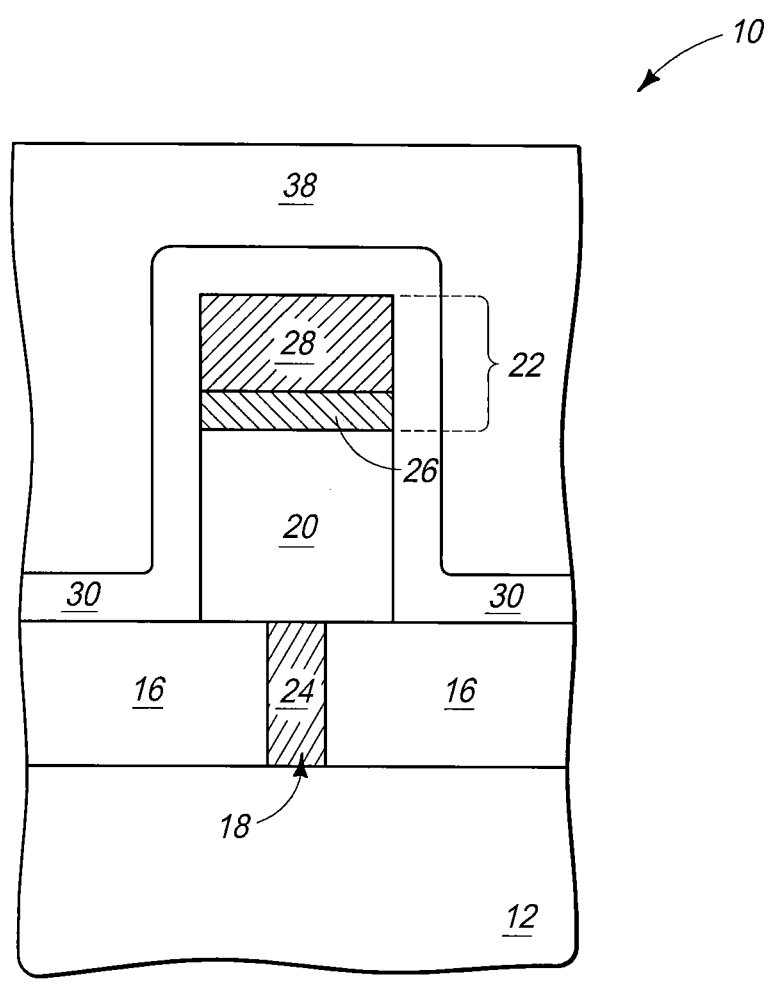

Referring to FIG. 5, the electrically insulative material 38 is formed over retaining shell material 30 to form the construction 10 described above with reference to FIG. 1. In subsequent processing, such construction may be thermally processed to a temperature in excess of 300° C. Such thermal processing may be utilized for fabrication of other components (not shown) of integrated circuitry supported by substrate 12. The thermal processing may induce a first stress due to thermal mismatch of the programmable material 20 and other materials directly adjacent to such programmable material, and the retaining shell material 30 may be tailored in composition and configuration to provide a second stress which is at least about equal to the first stress and which is configured to substantially balance the first stress. The retaining shell material can thus be configured to avoid delamination of the programmable material and/or to avoid other problems that may otherwise result from the thermally-induced first stress. Additionally, in some embodiments, one or more materials of the memory cell may be tailored to assist the retaining shell in canceling or alleviating thermally-induced stresses. For instance, one or both of the electrically conductive materials 26 and 28 may be tailored to assist in canceling or alleviating thermally-induced stresses.

Processing analogous to that of FIGS. 3-5 may be utilized to form a construction in which the retaining shell material comprises a laminate of two or more different materials, such as, for example, a construction analogous to that of FIG. 2.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method for fabricating a memory cell construction, comprising:
   forming a programmable material directly against a second material having a different coefficient of expansion than the programmable material;
   forming a third material adjacent the programmable material;
   exposing the programmable material, second material and third material to thermal processing to increase a temperature of the programmable material, second material and third material by at least about 200° C.; the exposure to said thermal processing creating a first stress due to the different rates of thermal expansion of the programmable material and the second material; the third material providing a second stress which is at least about equal to the first stress to substantially balance the first stress.

2. The method of claim 1 wherein the third comprises metal and/or carbon.

3. The method of claim 1 wherein the programmable material comprises germanium, antimony and tellurium; and wherein the third material comprises silicon nitride having an internal stress of at least about 500 megapascals.

4. The method of claim 3 wherein the second material comprises silicon nitride having an internal stress of less than or equal to about 200 megapascals.

5. The method of claim 1 wherein the third material is configured to extend at least about half-way around an outer periphery of the programmable material along a cross-section through the programmable material and the third material.

6. The method of claim 1 wherein the third material extends around at least about three-fourths of an outer periphery of the programmable material along a cross-section through the programmable material and the third material.

7. The method of claim 1 wherein the first stress is primarily a compressive stress, and wherein the second stress is primarily a tensile stress.

8. The method of claim 1 wherein the first stress is primarily a tensile stress, and wherein the second stress is primarily a compressive stress.

9. A method for fabricating a memory cell construction, comprising:

forming a base comprising a bottom electrode extending through an electrically insulative material, the electrically insulative material being supported by a semiconductor substrate;

forming programmable material over the base, a bottom surface of the programmable material extending across the bottom electrode and the electrically insulative material;

forming a top electrode over the programmable material;

patterning the top electrode and the programmable material to have coextensive sidewall surfaces along a cross-section through the top electrode and the programmable material;

forming a second material that extends along the sidewall surfaces of the programmable material and the top electrode, and that extends over the top electrode; and exposing the memory cell to thermal processing to increase a temperature of the programmable material, the base and the top electrode to at least about 300° C.; the exposure to said thermal processing creating a first stress due to thermal mismatch of the programmable material and the base; the second material providing a second stress which is at least about equal to the first stress to substantially balance the first stress.

10. The method of claim 9 wherein the programmable material comprises germanium, antimony and tellurium; wherein the electrically insulative material comprises silicon nitride having an internal stress of less than or equal to about 200 megapascals; and wherein the second material comprises silicon nitride having an internal stress of at least about 500 megapascals.

11. The method of claim 10 further comprising forming silicon dioxide to be directly between the silicon nitride of the second material and the programmable material.

12. A memory cell construction, comprising:
 a bottom electrode supported by a semiconductor substrate;
 a programmable material over the bottom electrode;
 a top electrode over the programmable material; and
 a retaining laminate that extends at least about half-way around an outer periphery of the programmable material along a cross-section through the programmable material and the retaining laminate; the retaining laminate extending along opposing sidewall surfaces of the programmable material, and extending over the top electrode; the retaining laminate comprising a first material and a second material, with said first material having an internal stress of at least about 500 megapascals.

13. The memory cell construction of claim 12 wherein at least one of the first and second materials comprises one or more of metal, carbon, silicon carbide and silicon nitride.

14. The memory cell construction of claim 12 wherein one of the first and second materials comprises silicon carbide, and the other of the first and second materials comprises carbon.

15. The memory cell construction of claim 12 wherein one of the first and second materials comprises silicon nitride.

16. A memory cell construction, comprising:
 a bottom electrode supported by a silicon-containing substrate;
 a programmable material over the bottom electrode;
 a top electrode over the programmable material; and
 a retaining material that extends at least about half-way around an outer periphery of the programmable material along a cross-section through the programmable material and the retaining material; the retaining material extending along opposing sidewall surfaces of the programmable material, and extending over the top electrode; the retaining material having an internal stress of at least about 500 megapascals.

17. The memory cell construction of claim 16 wherein the retaining material is electrically insulative.

18. The memory cell construction of claim 16 wherein the retaining material is electrically conductive.

19. The memory cell construction of claim 16 wherein the retaining material comprises a metal.

20. The memory cell construction of claim 16 wherein the retaining material comprises carbon.

21. The memory cell construction of claim 16 wherein the retaining material comprises silicon nitride.

\* \* \* \* \*